(12) United States Patent
Chan

(10) Patent No.: US 6,804,305 B1
(45) Date of Patent: Oct. 12, 2004

(54) WIDE COMMON MODE RANGE DIFFERENTIAL RECEIVER

(75) Inventor: Francis Chan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 806 days.

(21) Appl. No.: 09/634,376

(22) Filed: Aug. 9, 2000

(51) Int. Cl.[7] .............................................. H03F 3/45
(52) U.S. Cl. ..................... 375/257; 326/83; 326/102; 327/52; 327/108
(58) Field of Search .......................... 375/318; 327/52, 327/108; 330/252; 326/83, 102; 347/9; 360/46

(56) References Cited

U.S. PATENT DOCUMENTS

| | | | | | |
|---|---|---|---|---|---|
| 4,958,133 | A | * | 9/1990 | Bazes ......................... | 330/253 |
| 5,555,452 | A | * | 9/1996 | Callaway et al. ......... | 455/226.2 |
| 5,977,807 | A | * | 11/1999 | Watanabe ................... | 327/175 |
| 6,025,742 | A | * | 2/2000 | Chan .......................... | 327/108 |
| 6,049,229 | A | * | 4/2000 | Manohar et al. .............. | 326/83 |
| 6,057,734 | A | * | 5/2000 | Xu .............................. | 330/253 |
| 6,193,342 | B1 | * | 2/2001 | Suzuki ......................... | 347/9 |
| 6,208,178 | B1 | * | 3/2001 | Chen .......................... | 327/108 |
| 6,281,714 | B1 | * | 8/2001 | Ang et al. ..................... | 327/56 |
| 6,304,141 | B1 | * | 10/2001 | Kennedy et al. ............. | 330/253 |
| 6,353,335 | B1 | * | 3/2002 | Trop ........................... | 326/83 |
| 6,512,645 | B1 | * | 1/2003 | Patti et al. .................... | 360/46 |

OTHER PUBLICATIONS

M. Bazes; Two Novel Fully Complementary Self–Biased CMOS Differential Amplifiers; IEEE Journal of Solid–State Circuits; vol. 26, No. 2, Feb. 1991; pp. 165–168.*

J. Fisher et al.; A Highly Linear CMOS Buffer Amplifier; IEEE Journal of Solid–State Circuits; Sc–22, No. 3; Jun. 1987; pp. 330–334.*

Xiao et al., FP 15.7: A 500Mb/s. 20 Channel CMOS Laser Diode Array Driver for a Parallel Optical Bus. 1997 IEEE International Solid–State Circuits Conference, Digest of Technical Paper (IEEE 1997).

* cited by examiner

Primary Examiner—Stephen Chin
Assistant Examiner—Sudhanshu C. Pathak
(74) Attorney, Agent, or Firm—Richard A. Henkler; Cantor Coburn LLP

(57) ABSTRACT

Disclosed is a wide common mode range differential receiver comprising an input stage adapted to receive an input signal and its complement with wide common mode and output said signals as current signals; a plurality of self-cascode biasing stages adapted to receive said current signals and output a first analog differential voltage in phase with said input signal and a second analog differential voltage out of phase with said input signal; and a self-bias differential amplifier adapted to receive said first and second analog differential voltages and output an output signal with substantially reduced jitter.

4 Claims, 2 Drawing Sheets

US 6,804,305 B1

WIDE COMMON MODE RANGE DIFFERENTIAL RECEIVER

FIELD OF THE INVENTION

This invention relates to wide common mode range differential receivers.

BACKGROUND OF THE INVENTION

Low voltage differential sign (LVDS) receivers are known in the art for meeting the bandwidth demands of parallel optical bus technology. Prior art differential receivers are able to receive wide amplitude ranges of from 100 mV to 400 mV. Common mode amplitudes will typically range from 50 mV to 2,350 mV.

BRIEF SUMMARY OF THE INVENTION

Disclosed is a wide common mode range differential receiver comprising an input stage adapted to receive an input signal and its complement with wide common mode and output said signals as current signals; a plurality of self-cascode biasing stages adapted to receive said current signals and output a first analog differential voltage in phase with said input signal and a second analog differential voltage out of phase with said input signal; and a self-bias differential amplifier adapted to receive said first and second analog differential voltages and output an output signal with substantially reduced jitter.

DETAILED DESCRIPTION OF THE INVENTION

Figure 1:
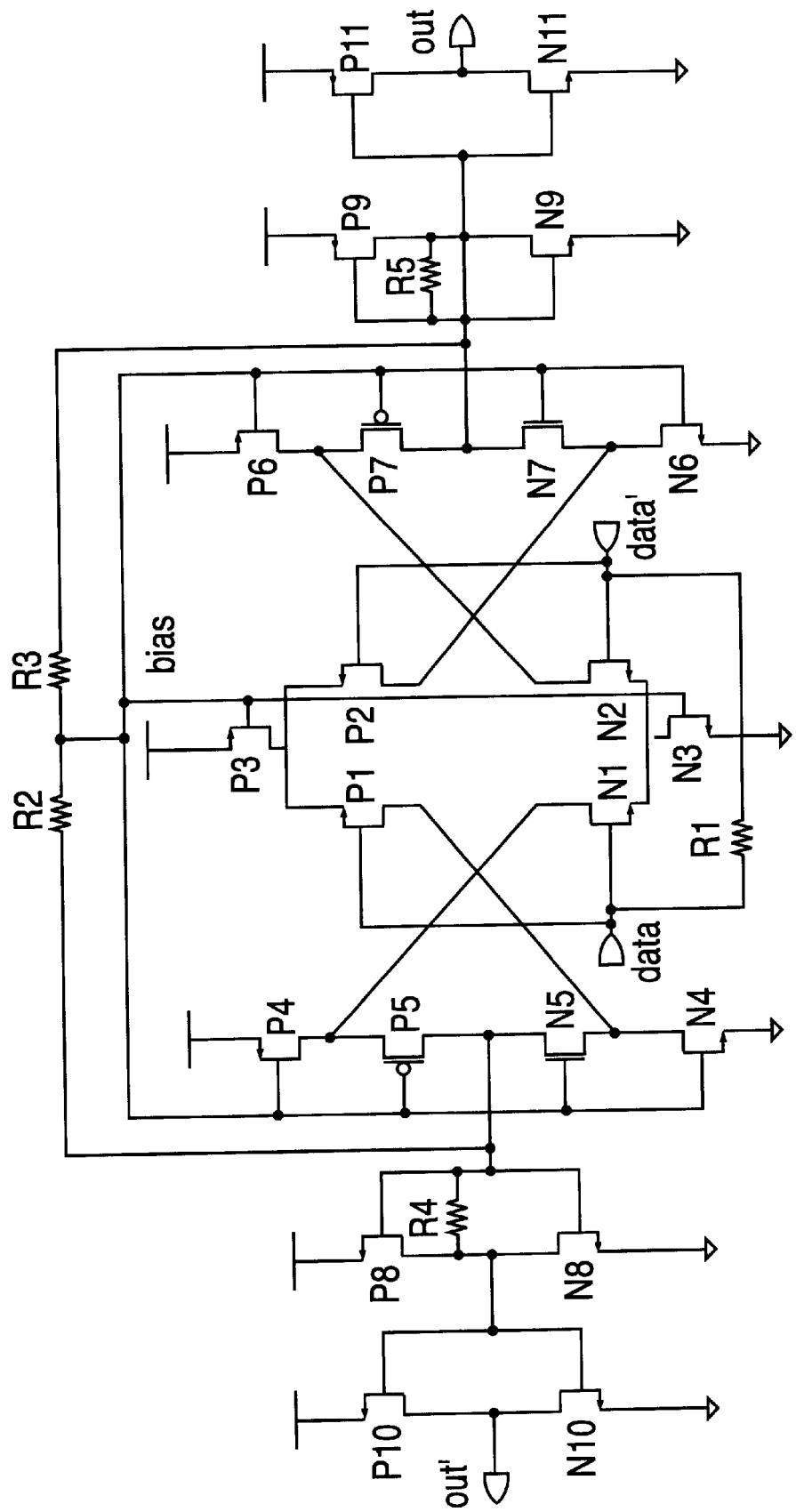
FIG. 1 shows a circuit of the prior art.

Referring to FIG. 1, there is shown a schematic of a fully differential low voltage differential signal (LVDS) receiver of the prior art. The receiver is self-biased, which enables the receiver to be insensitive to long range parameter drifts. The differential configuration reduces skew between true (out) and complementary (out') outputs. The receiver comprises an input stage, a plurality of self-cascode biasing stages, a plurality of current-to-voltage (I-to-V) converters, and a plurality of inverters.

Referring in more detail to FIG. 1, an input signal (data) and its complement (data') are received into an input stage comprising an nMOS block comprising a plurality of nMOS transistors N1, N2, N3 and a pMOS block comprising a plurality of pMOS transistors P1, P2, P3 that allow the circuit to receive signal with wide input common mode and convert the voltage-modulated signal and its complement into current-modulated signals. The current output of both CMOS blocks are summed in first and second self-cascode biasing stages, each comprising a plurality of nMOS and pMOS transistors N4, N5, P4, P5 and N6, N7, P6, P7. The output from the first biasing stage is inverted with respect to the input signal (data), while that of the second stage is in phase with the input signal (data). The outputs from these first and second biasing stages are each inputted into first (N8, P8, R4) and second (N9, P9, R5) I-to-V converters, respectively, The outputs of the first and second I-to-V converters are then inputted into first (NT10, P10) and second (N11, P11) inverters, which amplify the signals and deliver output signal, The second inverter delivers the normal rail-to-rail output signal (out) while the first inverter delivers its complement (out').

Note that common mode feedback is achieved by biasing N3 and P3 with the common mode output voltages of the self-cascode biasing stages. The common mode output may easily be sampled by two resistors R2 and R3 because the impedances at the self-cascode biasing stage outputs are mainly determined by resistors R4 and R5. Resistor R1 provides impedance matching for input and will usually be around 100Ω for most applications. A detailed description of a use of the receiver may be found in Xiao et al., *FP 15.7: A 500 Mb/s. 20Channel CMOS Laser Diode Array Driver for a Parallel Optical Bus*, 1997 IEEE International Solid-State Circuits Conference, Digest of Technical Papers (IEEE 1997), the disclosures of which are incorporated by reference herein in their entirety.

The problem with the prior art receiver of FIG. 1, however, is that the design displays large jitter variation at higher frequency signals. This worsens as faster switching frequencies under input common mode range are required.

Figure 2:
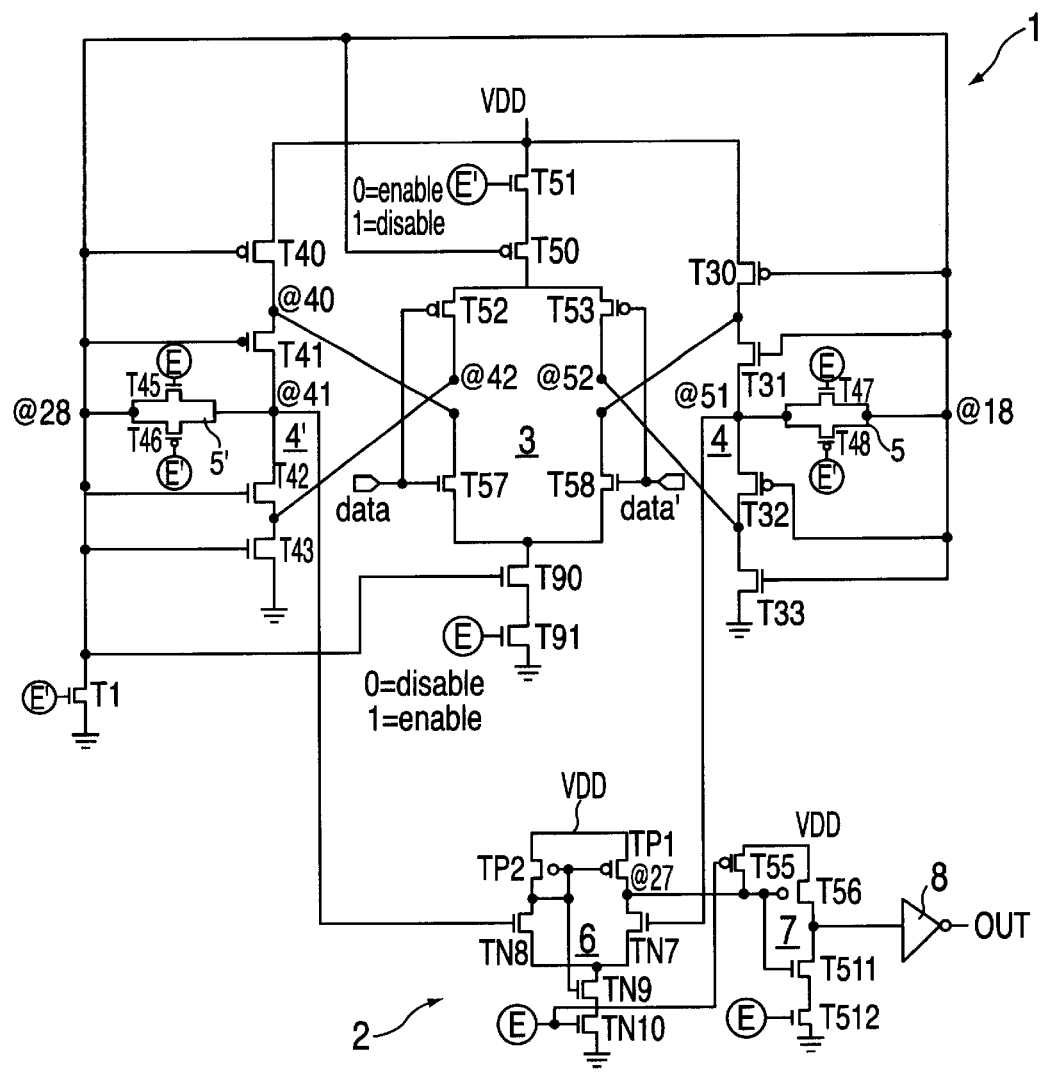
FIG. 2 shows an embodiment of the invention.

FIG. 2 shows the circuit of the invention that displays minimal jitter variation during high frequency switching (1 GHZ range) while allowing a very wide input common range. Note that the first receiver stage 1 is nearly identical to the LVDS receiver of the prior art with some modification, the most notable modification being the replacement of the I-to-V converters and inverters with transmission gates 5, 5'. Note also that the specific use of either nMOS or pMOS transistors is not critical and hence, the designation "T" is used to indicate the use of either nMOS or pMOS interchangeably.

The input stage 3 is identical to that of the prior art receiver excepting the optional addition of a pair of control transistors T51 and T91 that act in conjunction with the transmission gates 5, 5'. When the enable gates E to T91, T45, T47, TN10, and T512 are held at logical "1" and the inverse enable gates E' to T51, T46, T48, and T1 are held at logical "0", then the first receiver stage 1 is activated. It is up to the user to determine what control circuitry to provide to control the enable and inverse enable gates, as such circuitry is not a part of this invention. The gates are also easily adapted to control the voltage swing of the signal. When the signals are inversed, the first receiver stage 1 is shut off. This provides a convenient control scheme for the circuit. Note also that resistors R1, R2, and R3 are not included in the first receiver stage 1 of the invention, though they can be at the option of the user.

Continuing with FIG. 1, the outputs of the self-cascode biasing stages 4, 4' are inputted into the second receiver stage 2. The second receiver stage comprises a self-bias differential amplifier 6, a NAND gate 7, and an inverter 8. Note that the voltage drop across the transmission gates 5, 5' determines the analog differential voltage swing at the first biasing node @41 and the second biasing node @51, the first node @41 being out of phase with the input signal (data) and the second node @51 being in phase. The analog differential signals from these nodes enter the self-bias differential amplifier 6 of the second receiver stage 2. The self-bias differential amplifier comprises both nMOS and pMOS transistors designated by the letters "TN" and "TP" respectively.

The combination of optimizing the differential signal at node @41 and at node @51 and magnifying the signal by the self-bias differential amplifier 6 enables the receiver circuit to operate in the 1 GHZ frequency range with less than 20 ps of jitter variation at the output. The combination of the first and second stages allows the circuit to receive differential input signal swings (as small as 50 mV peak-to-peak) over a very wide input common mode range (0V to VDD).

The output of self-bias differential amplifier is at node @27, which feeds the substantially reduced jitter signal into the NAND gate 7 and thence on to an inverter 8 to produce the final output signal (out), which is in phase with the original input (data). The other input to the NAND gate 8 is the enable gate E to CMOS TN 10. Hence, the function of the NAND gate 8 is as a control to shut off the signal if desired and maybe considered optional to the invention.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A wide common mode range differential receiver, comprising:
    an input stage adapted to reeve an input signal and its complement with wide common mode and output intermediate signals as current signals;
    a plurality of self-cascode biasing stages adapted to receive said current signals and output a first analog differential voltage in phase with said input signal and a second analog differential voltage out of phase with said input signal; and
    a self-bias differential amplifier adapted to receive said first and second analog differential voltages and output an output signal;
    wherein said input stage further comprises a plurality of transmission gates, said transmission gates configured to selectively couple said input state to said self-bias amplifier, and said transmission gates further configured to provide a voltage drop thereacross so as to control an analog voltage swing of said first and said second analog differential voltages, and wherein said output signal has a jitter variation of less than about 20 picoseconds at an operating frequency of about 1 GHz.

2. The apparatus of claim 1 further comprising a plurality of control transistors that are adapted to act in connection with said transmission gates to activate or deactivate said input stage.

3. The apparatus of claim 1 wherein said input stage further comprises a plurality of transistor blocks adapted to receive signals with wide input common mode and convert said signals to current-modulated signals.

4. The apparatus of claim 1 further comprising a NAND gate and an inverter.

* * * * *